(12) United States Patent
Tateoka et al.

(10) Patent No.: US 6,509,641 B2
(45) Date of Patent: Jan. 21, 2003

(54) HIGH-FREQUENCY SIGNAL AMPLIFICATION DEVICE

(75) Inventors: Kazuki Tateoka, Osaka (JP); Noriyuki Yoshikawa, Osaka (JP); Kunihiko Kanazawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/864,709

(22) Filed: May 23, 2001

(65) Prior Publication Data

US 2001/0048164 A1 Dec. 6, 2001

(30) Foreign Application Priority Data

May 24, 2000 (JP) ........................................ 2000-153611

(51) Int. Cl.[7] ............................................. H01L 23/053
(52) U.S. Cl. ........................ 257/700; 257/728; 257/758
(58) Field of Search .................................. 257/700, 701, 257/758, 778, 780, 678, 759, 728, 702, 703, 784; 438/106, 121, 125, 622; 174/52.2, 52.3, 52.4

(56) References Cited

U.S. PATENT DOCUMENTS

| 5,235,208 A | * | 8/1993 | Katoh ........................... 257/691 |
| 5,387,888 A | * | 2/1995 | Eda et al. ..................... 257/664 |
| 5,510,758 A | * | 4/1996 | Fujita et al. ................. 257/778 |
| 5,627,408 A | * | 5/1997 | Kusumi ....................... 257/784 |
| 5,656,857 A | * | 8/1997 | Kishita ........................ 257/690 |
| 5,717,249 A | * | 2/1998 | Yoshikawa et al. ......... 257/728 |
| 5,796,165 A | * | 8/1998 | Yoshikawa et al. ......... 257/728 |

FOREIGN PATENT DOCUMENTS

| JP | 2-198158 | * | 8/1990 |
| JP | 7-170090 |   | 7/1995 |

* cited by examiner

Primary Examiner—Albert W. Paladini
Assistant Examiner—Alonzo Chambliss
(74) Attorney, Agent, or Firm—Merchant & Gould P.C.

(57) ABSTRACT

The present invention provides a high-frequency signal amplification device, in which insufficient isolation is compensated and which is made smaller, as well as a method for manufacturing the same. A substrate, in which a plurality of metal conductors arranged between the plurality of dielectric layers and/or at a surface of the dielectric multilayer substrate are exposed at a first region of the surface, and a metal surface that is arranged at a position lower than the plurality of metal conductors is exposed from a remaining portion of the first region not including the region on which the plurality of metal conductors are arranged, is used as a dielectric multilayer substrate. The semiconductor element is mounted in the first region such that a high-frequency signal is input into the semiconductor element via at least one of the plurality of metal conductors, and an amplified high-frequency signal is output from the semiconductor element via at least another one of the plurality of metal conductors.

9 Claims, 17 Drawing Sheets

HIGH-FREQUENCY SIGNAL AMPLIFICATION DEVICE

BACKGROUND OF THE INVENTION

1. Field of the Invention

The present invention relates to high-frequency signal amplification devices and to methods for manufacturing the same. The present invention particularly suitable to devices for amplifying signals in high-frequency bands (above 800 MHz, especially 800 MHz to 2 GHz).

2. Description of the Related Art

Semiconductor elements for amplification of high-frequency signals (high-frequency amplifiers) used in mobile communication, for example in cell phones, often are mounted on dielectric multilayer substrates with multilayer interconnections, in order to achieve smaller size and lighter weight. Also, to achieve smaller size, recess portions (cavities) are formed on a portion of the surface of the dielectric multilayer substrates, and semiconductor elements are mounted in such cavities.

FIG. 14, FIG. 15 (cross-sectional view along the line V—V in FIG. 14), and FIG. 16 (cross-sectional view along the line VI—VI in FIG. 14) show an example of a conventional high-frequency signal amplification device, in which a semiconductor element is mounted in a cavity. This high-frequency signal amplifier uses a dielectric multilayer substrate 101 with four dielectric layers 111, 112, 113, and 114. When layering the dielectric layers, the dielectric layers are provided with a hole, thus forming a cavity 104. Metal conductors 102, 103 (131, 132 . . . 137 . . . ) formed on the dielectric layers 112 and 113 are exposed at the cavity 104. In this high-frequency signal amplification device, a semiconductor element 105 is die-bonded to the metal conductor 102, and wire-bonded with metal wires 106 to the metal conductors 131, 132 . . . 137 . . . , which are formed at a higher position (closer to the surface) than the metal conductor 102.

However, when the semiconductor element 105 is made smaller, and thus the spacing between the metal conductors 131, 132 . . . 137 . . . is made narrower, in order respond for miniaturization, the problem of so-called insufficient isolation is aggravated. With insufficient isolation, capacitive coupling between the metal conductors tends to occur in the high-frequency band, due to the shrinking distance L' between the metal conductors (see FIG. 15). Thus, insufficient isolation leads to instability of the operation of the element, and depending on the operating conditions, may lead to oscillations.

In order to eliminate insufficient isolation, JP H07-170090A suggests providing separation grooves between circuits in a dielectric substrate with a base metal on which a FET carrier is mounted. As shown in FIG. 17, a separation groove 201 is formed in a dielectric substrate 204, for example between an output circuit 202 and an interstage circuit 203 between stages of amplification with a plurality of FETs. When this separation groove is formed, the dielectric constant of air (which is 1) in the separation groove is smaller than the dielectric constant of the dielectric substrate, so that dielectric coupling due to electric fields between the circuits can be suppressed. The above-noted publication also discloses a method for forming the separation groove by die cutting together with an aperture accommodating the FET carrier before baking the dielectric substrate.

In order to mount the FETs on the carrier and place the carrier on the dielectric substrate of the device disclosed in JP H07-170090A, it is necessary to provide the carrier with die bonding regions, wire bonding pad regions, etc., and to provide the aperture portion of the substrate with a margin when placing the carrier. For this reason, this dielectric substrate is less suitable for miniaturization than the device using a dielectric multilayer substrate as shown in FIGS. 14 to 16. Also, since for manufacturing reasons it is necessary to provide a margin (M' in FIG. 17) between the edge of the circuits and the edge of the separation groove disclosed in JP H07-170090A, this margin becomes an obstacle to shortening the distance between the circuits. Considering the precision of the actual manufacturing steps, it is necessary to provide a margin M' of about 200 $\mu$m. When this margin cannot be ensured, there is the danger that the width of the conductors is reduced by the separation groove, so that their impedance changes, which leads to a degradation of the high-frequency characteristics.

Consequently, when trying to apply the separation groove disclosed in JP H07-170090A to a high-frequency signal amplification device using the dielectric multilayer substrate shown in FIGS. 14 to 16, it is necessary to ensure a sufficient margin M', so that the spacing between the metal conductors becomes large, which runs counter to attempts to make the device smaller.

SUMMARY OF THE INVENTION

Thus, with conventional high-frequency signal amplification devices, it is difficult to make the device smaller and at the same time ensure isolation. Therefore, it is an object of the present invention to provide a high-frequency signal amplification device, in which insufficient isolation is compensated and which is made smaller, as well as a method for manufacturing the same.

In order to achieve this object, a high-frequency signal amplification device in accordance with the present invention includes:

a dielectric multilayer substrate including a plurality of dielectric layers;

a semiconductor element with high-frequency signal amplification function mounted on the dielectric multilayer substrate;

a plurality of metal conductors arranged between the plurality of dielectric layers and/or at a surface of the dielectric multilayer substrate; and a metal surface that is arranged at a position lower than the plurality of metal conductors;

wherein the metal conductors are exposed at a portion of a first region of the surface of the dielectric multilayer substrate, and the metal surface is exposed from a remaining portion of the first region not including the region on which the plurality of metal conductors are arranged;

wherein the semiconductor element is mounted on the first region; and wherein a high-frequency signal is input into the semiconductor element via at least one of the plurality of metal conductors, and an amplified high-frequency signal is output from the semiconductor element via at least another one of the plurality of metal conductors.

With this high-frequency signal amplification device of the present invention, dielectric material is removed from a first region arranged for mounting the semiconductor element, which does not include the region on which the plurality of metal conductors are arranged, so that the device can be made smaller and at the same time, insufficient isolation can be compensated.

In order to achieve the above-mentioned object, a method for manufacturing a high-frequency signal amplification device comprising a dielectric multilayer substrate including a plurality of dielectric layers, and a semiconductor element with high-frequency signal amplification function mounted on the dielectric multilayer substrate, includes the steps of:

preparing a dielectric multilayer substrate in which a plurality of metal conductors are formed on a surface of at least one of the plurality of dielectric layers, such that, in any range within a first region of a first surface of the dielectric multilayer substrate, proceeding from the surface of the dielectric multilayer substrate in a depth direction of the dielectric multilayer substrate, the plurality of metal conductors or a metal surface that is arranged at a position lower than the plurality of metal conductors is reached before reaching a second surface of the dielectric multilayer substrate;

removing, with an agent capable of acting in a direction substantially vertical to the surface of the dielectric multilayer substrate and removing dielectric materials more readily than metals, in the first region of the dielectric multilayer substrate, a dielectric layer in a depth direction from the first surface of the dielectric multilayer substrate until reaching the metal conductors or the metal surface, and exposing the metal conductors and the metal surface in the first region; and mounting the semiconductor element in the first region, such that a high-frequency signal is input into the semiconductor element via at least one of the plurality of metal conductors, and an amplified high-frequency signal is output from the semiconductor element via at least another one of the plurality of metal conductors.

According to this method for manufacturing a high-frequency signal amplification device in accordance with the present invention, dielectric material is selectively removed with laser light, so that there is no need to provide a margin for manufacturing reasons, as when forming separation grooves. With this manufacturing method, a high-frequency signal amplification device can be provided in which dielectric layers, not including the region where the metal conductors are formed, are selectively removed.

DESCRIPTION OF THE PREFERRED EMBODIMENTS

The following is a description of the preferred embodiments of the present invention.

In the high-frequency signal amplification device of the present invention, it is preferable that the spacing between the metal conductors for input or output of a high-frequency signal is at least 10 $\mu$m and at most 300 $\mu$m. This spacing is suitable to make the device smaller while ensuring isolation.

In the high-frequency signal amplification device of the present invention, it is preferable that the semiconductor element is bonded to the metal surface arranged at a lower position than the plurality of metal conductors, and that the semiconductor element is electrically connected to the plurality of metal conductors by metal wires. The semiconductor element can be bonded face-down to the plurality of metal conductors.

In the high-frequency signal amplification device of the present invention, it is preferable that the semiconductor element is mounted such that it does not protrude upward beyond the surface of the dielectric multilayer substrate, because this is advantageous in making the device smaller.

In the high-frequency signal amplification device of the present invention, it is preferable that the metal surface arranged at a lower position than the plurality of metal conductors is the surface of a metal conductor that is arranged on the surface of one of the plurality of dielectric layers, and that this metal conductor is disposed over a region that extends at least 50 $\mu$m beyond the edge of the first region. Thus, even if a discrepancy occurs during the layering of the layered product, it is possible to manufacture the device in a reliable manner with the manufacturing method described below.

Moreover, in this high-frequency signal amplification device, the semiconductor element can be sealed by a resin, in order to protect the semiconductor element.

The following is a more specific description of the present invention, with reference to the accompanying drawings.

First Embodiment

Figure 1:
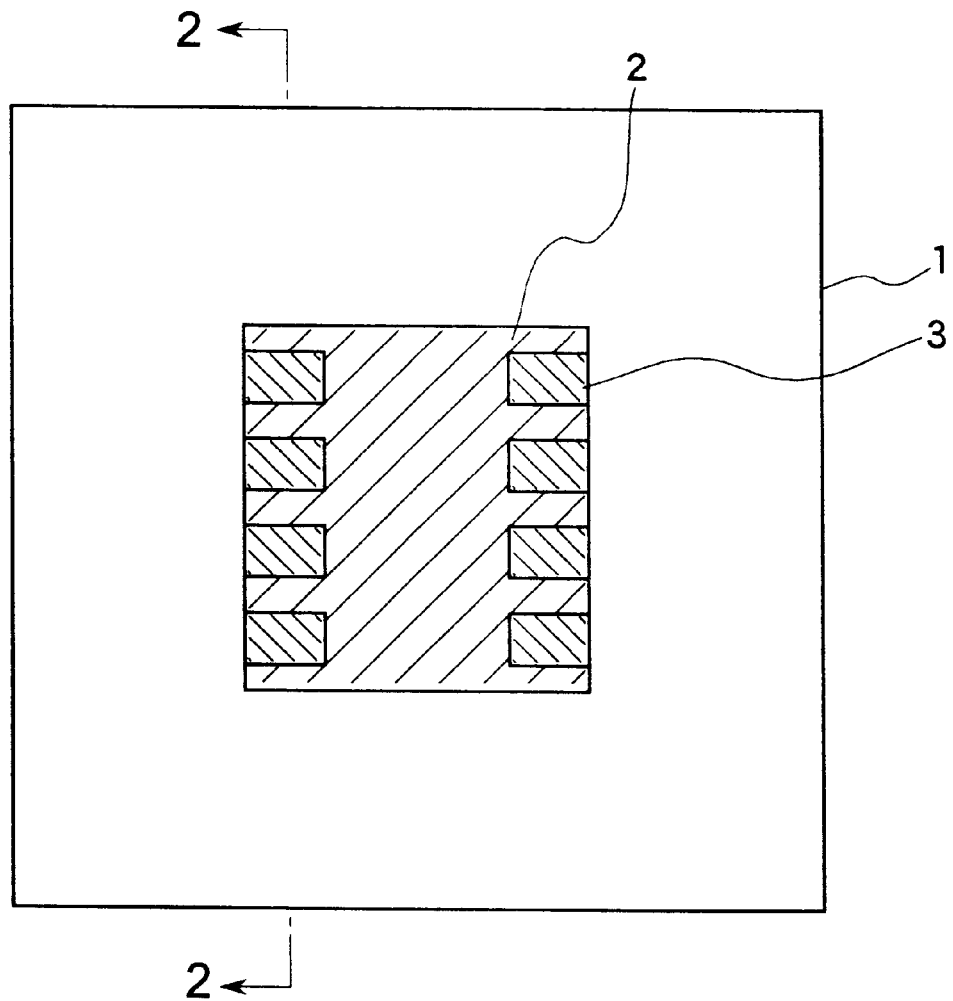
FIG. 1 is a plan view of a dielectric multilayer substrate used in a high-frequency signal amplification device of the present invention.
Figure 2:
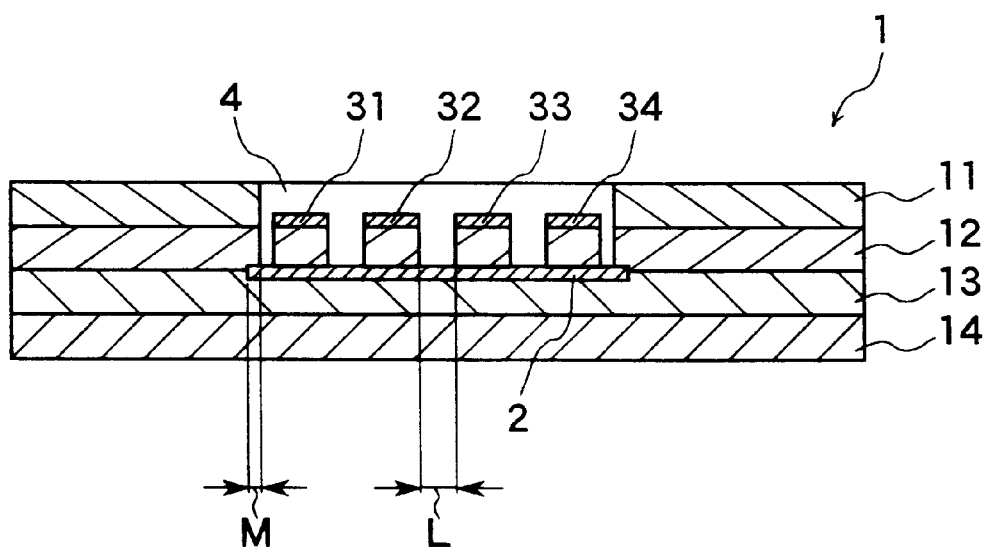
FIG. 2 is a cross sectional view along the line I—I in FIG. 1.

FIG. 1 is a plan view of a dielectric multilayer substrate used for a high-frequency signal amplification device of this embodiment. FIG. 2 is a cross-sectional view taken along the line I—I in FIG. 1. This dielectric multilayer substrate 1 includes four dielectric layers (first dielectric layer 11, second dielectric layer 12, third dielectric layer 13, and fourth dielectric layer 14, layered in that order from top to bottom in FIG. 2). Metal conductors 3 (31, 32 . . . 37 . . . ) are formed on the surface of the second dielectric layer 12, and a metal conductor 2 is formed on the surface of the third dielectric layer 13. Moreover, a through hole has been machined into the first dielectric layer 11 and the second dielectric layer 12, so that a recess (cavity) 4 is formed at the surface of the dielectric multilayer substrate 1.

The outer edge of the cavity 4 is formed like a rectangular frame, when viewing the dielectric multilayer substrate 1 from above. The region inside this rectangular frame serves as the mounting region for a semiconductor element. When viewing the surface provided with the cavity in the perpendicular direction, only the plurality of metal conductors 3 (31, 32 . . . 37) and the metal conductor 2 that is exposed between these metal conductors can be seen in the mounting region. Thus, the dielectric multilayer substrate 1 is characterized in that, when viewed from above, substantially only metal surfaces can be seen in the cavity 4. In other words, in the cavity 4, the surfaces of the dielectric layers facing the aperture side are all covered with metal.

In the cavity 4, the metal conductors are arranged between a plurality of layers (in this example, between two layers). Thus, the cavity 4 is provided with a step. The edges of the metal conductors 31, 32 . . . 37 substantially matches with the edge of the second dielectric layer 12 supporting the conductors.

Figure 3:
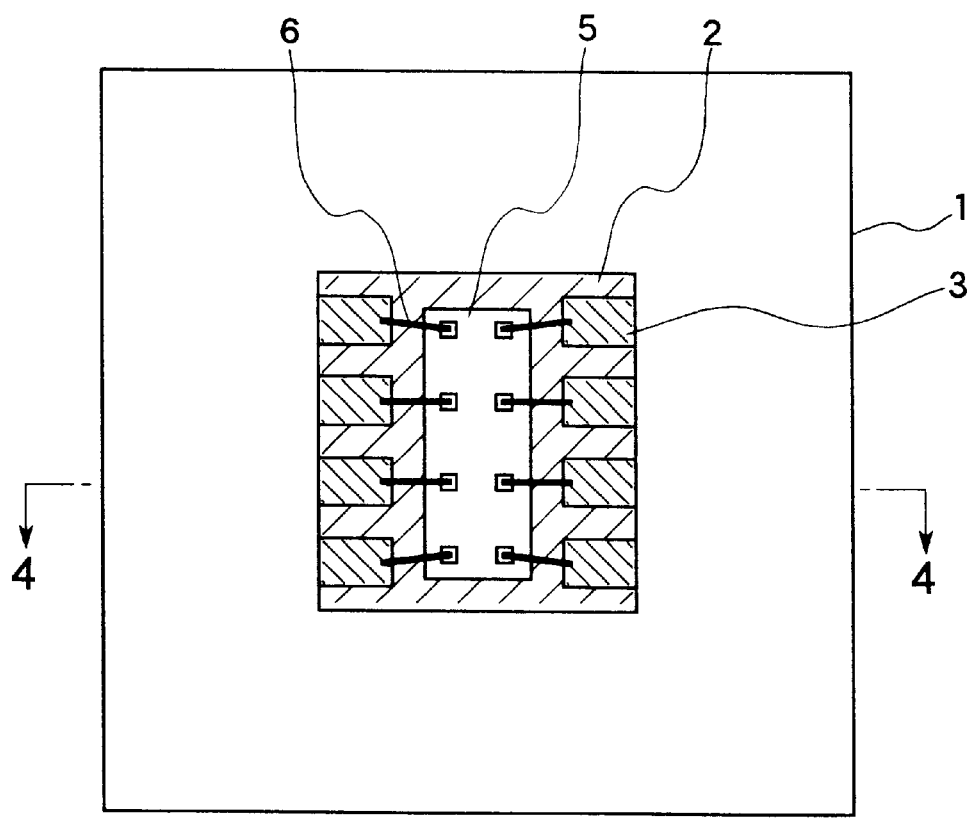
FIG. 3 is a plan view of a high-frequency signal amplification device according to the present invention.
Figure 4:
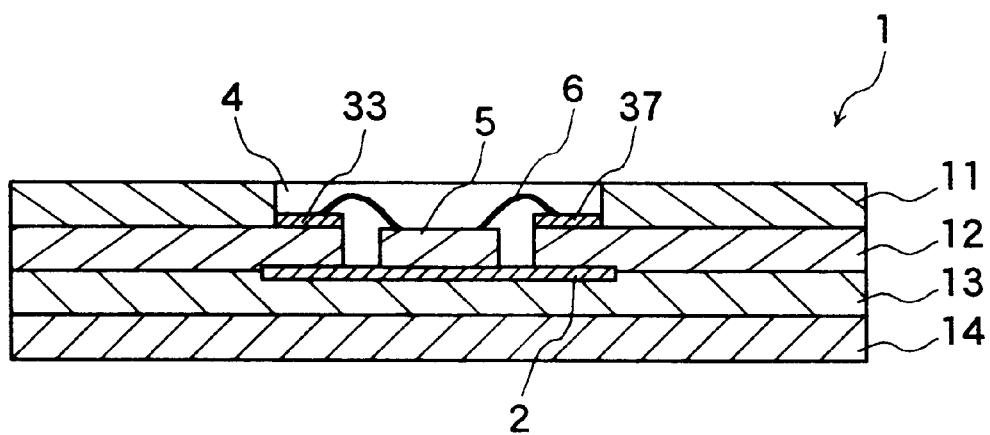
FIG. 4 is a cross-sectional view along the line II—II in FIG. 3.

FIGS. 3 and 4 (cross-sectional view along the line II—II in FIG. 3) show a high-frequency amplification device, in which a semiconductor element having the function to amplify high-frequency signals is mounted on a dielectric multilayer substrate. Taking the lower metal conductor 2 as the die attach surface, the semiconductor element 5 attached by die-bonding. Furthermore, the semiconductor element 5 is connected by metal wires 6 to the upper metal conductors 31, 32 . . . 37 (wire bonding). Thus, utilizing the multilayer structure of the dielectric multilayer substrate, circuits are connected to the semiconductor element, and an amplification circuit for the amplification of high-frequency signals is accomplished. This circuit includes various receiving elements (not shown in the drawings). The connection between the dielectric layers can be performed using via holes. In this embodiment, utilizing the step in the cavity, the semiconductor element is mounted at a position that is lower than the metal conductors for wire bonding, which shortens the length of the metal wires 6. The shorter the length of the metal wires 6 is, the smaller is their inductive component.

Figure 5:
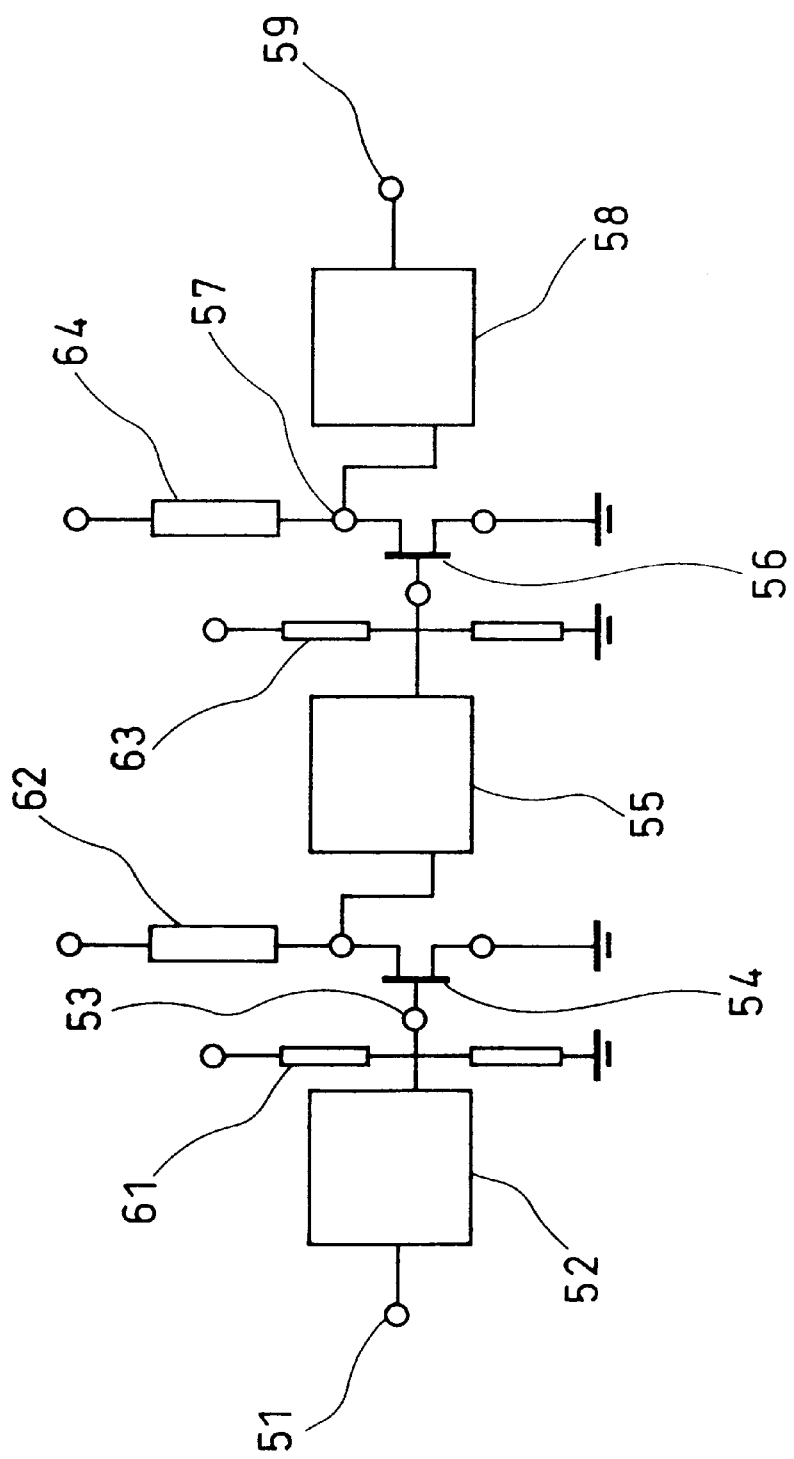
FIG. 5 is a plan view of a signal amplification circuit used in a high-frequency signal amplification device of the present invention.

FIG. 5 is an example of a high-frequency signal amplification circuit. In this circuit, high-frequency signals that have been input from an input terminal 51 are amplified with two field-effect transistors (FETs) 54 and 56, and are output from the output terminal 59. The FETs are connected to input and/or output matching circuits 52, 55 and 58, and are further connected to the gate bias circuits 61 and 63, and to the drain bias circuits 62 and 64.

Figure 6:
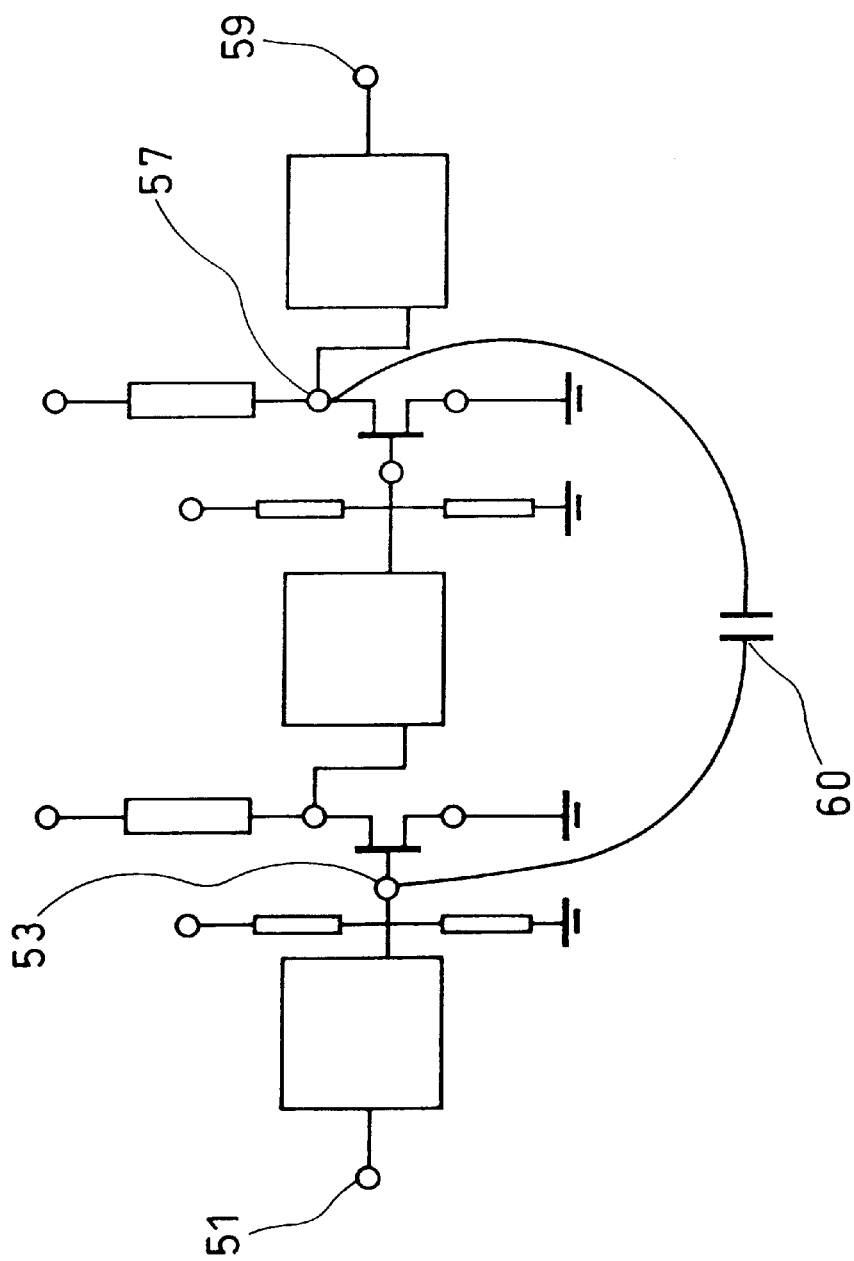
FIG. 6 illustrates the high-frequency coupling in the circuit of FIG. 5.

In such an amplification circuit for high-frequency signals, it is important to ensure sufficient isolation between the terminals in order to achieve a stable operation. In the conventional device shown in the FIGS. 14 to 16, there is a dielectric material with a high dielectric constant between the metal conductors connecting the terminals, so that capacitive coupling 60 tends to occur between the terminals, for example between the input terminal 53 of the FET 54 serving as the first-stage amplification element and the output terminal 57 of the FET 56 serving as the second-stage amplification element, as shown in FIG. 6. When such high-frequency coupling occurs, the level of signal leakage from the output side to the input side rises.

However, as shown by this embodiment, when the metal conductors have to be placed closer to one another near the semiconductor element in order to connect the semiconductor element, the electric field concentration between the metal conductors can be diminished and the insufficient isolation between the terminals can be compensated, if the dielectric layer between the metal conductors is eliminated. Moreover, in this embodiment, the dielectric layer between the metal conductors is eliminated except for the region that is utilized to support the metal conductor. Consequently, the electric field concentrations due to the dielectric layer between the metal conductors are diminished considerably, and the leakage of signals from the output side to the input side can be suppressed effectively.

Figure 7:
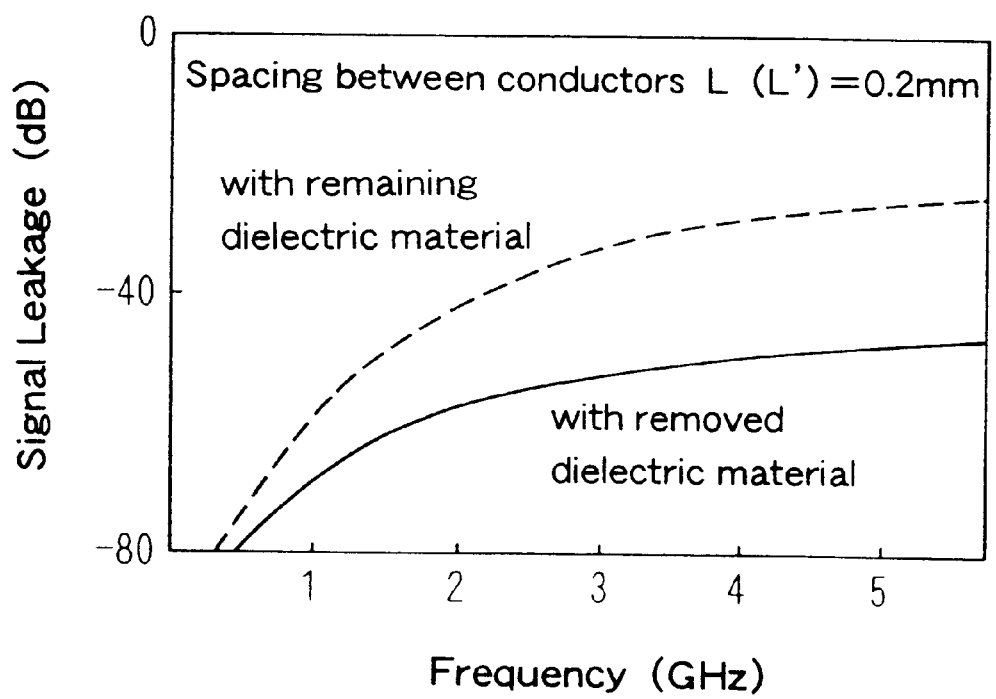
FIG. 7 is a graph illustrating the difference in signal leakage for a high-frequency signal amplification device in accordance with the present embodiment and a conventional high-frequency signal amplification device.
Figure 14:
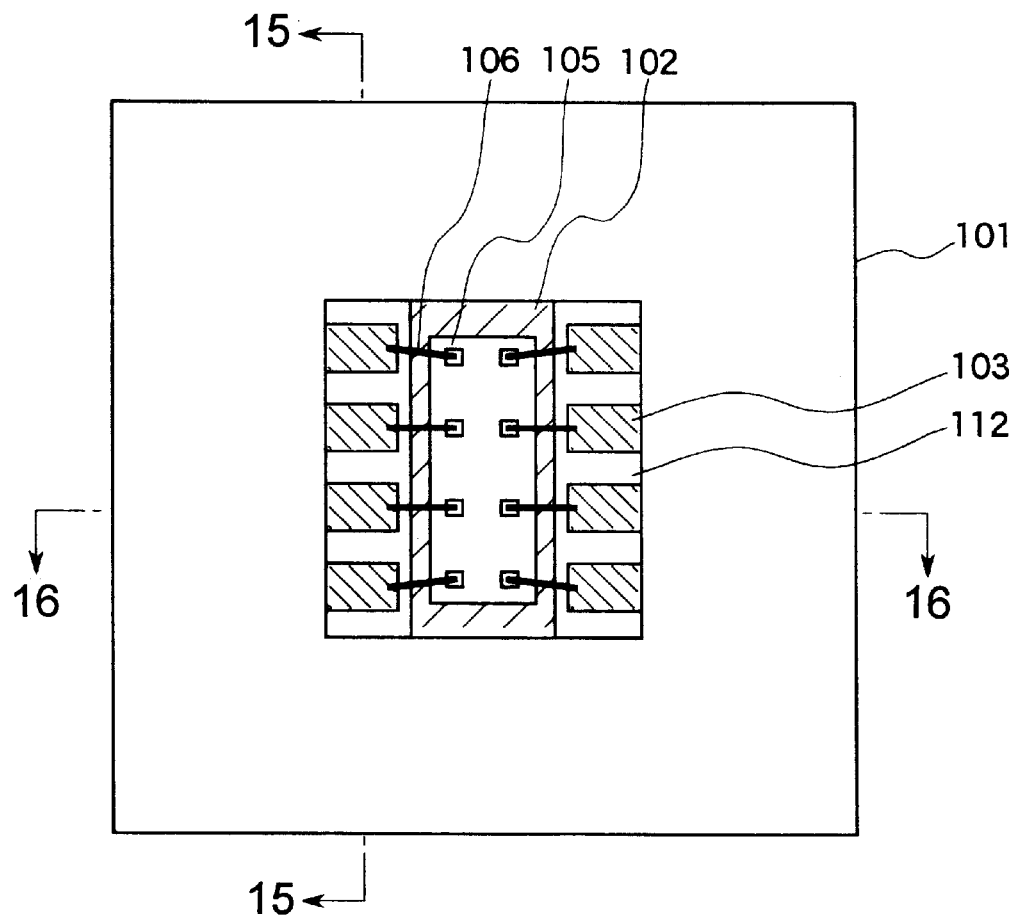
FIG. 14 is a plan view illustrating a conventional high-frequency signal amplification device.
Figure 15:
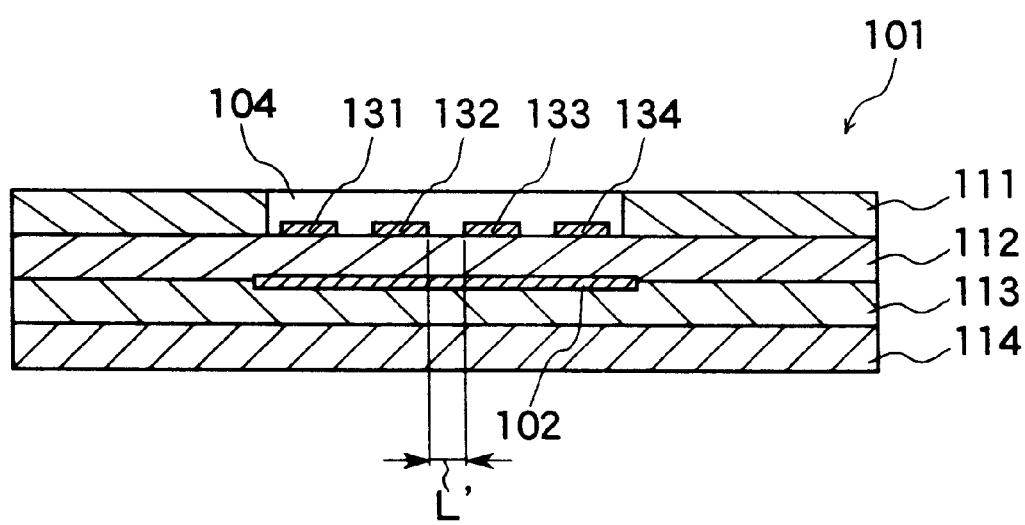
FIG. 15 is a cross-sectional view along the line V—V in FIG. 14.
Figure 16:
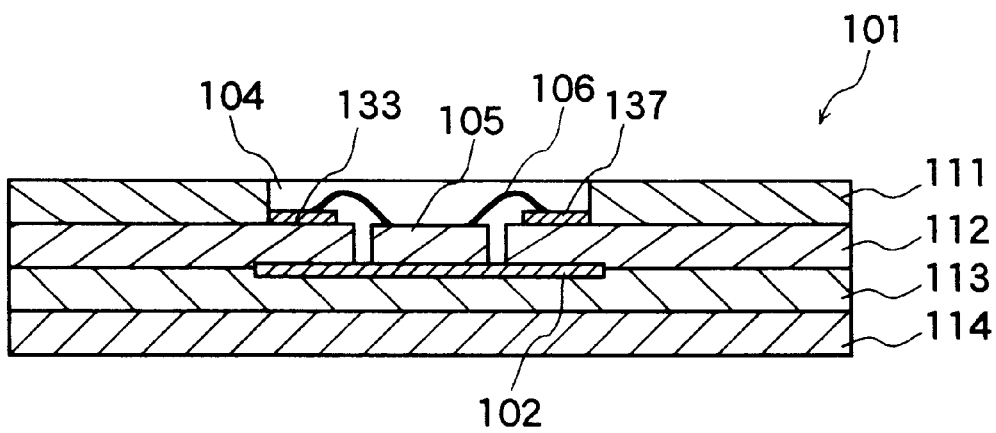
FIG. 16 is a cross-sectional view along the line VI—VI in FIG. 14.
Figure 17:
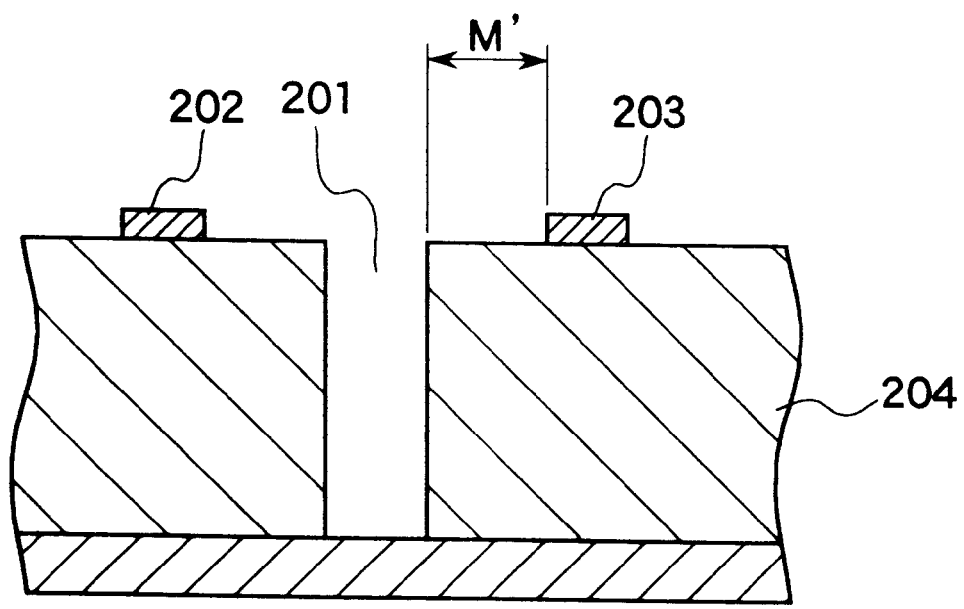
FIG. 17 is a cross-sectional view illustrating a separation groove used for a conventional high-frequency signal amplification device.

FIG. 7 illustrates the influence of the isolation between the conductors (metal conductors 31 and 32 in FIG. 2) in comparison for a high-frequency signal amplification device in accordance with the present embodiment (with removed dielectric layer) and a conventional high-frequency signal amplification device (with remaining dielectric layer; see FIGS. 14 to 16). In particular in high-frequency bands of ca. 800 MHz and above, the level of signal leakage can be improved by 10 dB and more with the present embodiment. In this comparison, the spacing between the conductors was set to 200 $\mu$m.

It is preferable that the spacing between the metal conductors (L in FIG. 2) is at least 10 $\mu$m and at most 300 $\mu$m. When the spacing is too small, the electric field concentration may not be diminished sufficiently, and when it is too large, it is inconvenient when making the device smaller, so that this spacing is more preferably set to at least 50 $\mu$m, and even more preferably to not more 150 $\mu$m.

The following is an explanation of a method for manufacturing this high-frequency signal amplification device.

Figure 8A:
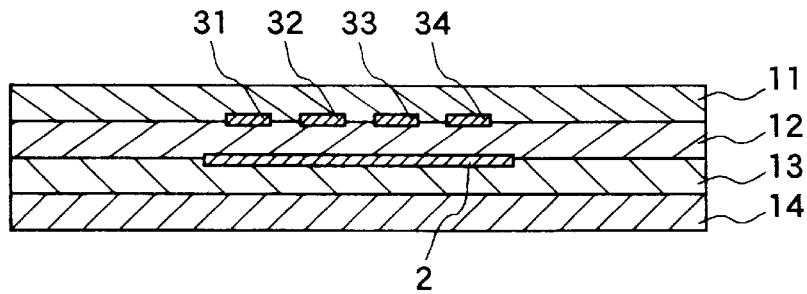
FIGS. 8A to 8C illustrate a method for manufacturing a high-frequency signal amplification device in accordance with the present invention.

First, a dielectric multilayer substrate as shown in FIG. 8A is prepared. Such a dielectric multilayer substrate can be prepared by any of the conventionally known methods. More specifically, it can be prepared by taking dielectric sheets with metal conductors printed in a predetermined arrangement on the surface, and laminating the dielectric sheets together.

Figure 8B:
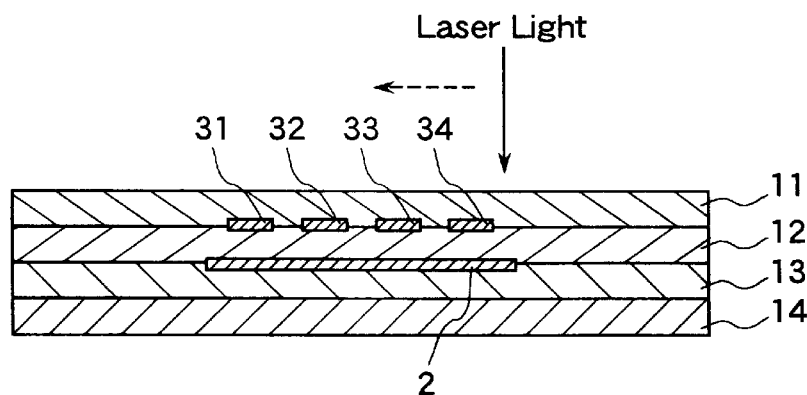
Figure 8C:
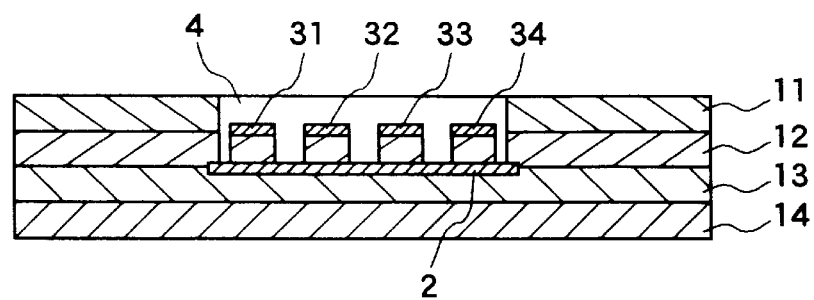

Then, laser light is irradiated on predetermined regions of the surface of the dielectric multilayer substrate (see FIG. 8B). The laser light can be irradiated from a substantially direction perpendicular to the surface of the multilayer substrate in a scanning motion on a first region of the multilayer substrate. When irradiating with the laser light, dielectric material absorbing the energy of the laser light is eliminated, so that dielectric material can be shaved off the surface of the multilayer substrate. Also, since the metal does not absorb as much laser light energy as the dielectric material, it is possible to halt the shaving of material when reaching the metal surface. Thus, it is possible to form a recess in the surface of the multilayer substrate, utilizing the metal surface as a surface for regulating the depth of the shaving with the laser light. As a result, a dielectric multilayer substrate having a recess (cavity) 4 as shown in FIGS. 1 and 2 can be obtained (see FIG. 8C).

There is no particular limitation with regard to the laser light used for forming the recess as described above, and it is possible to use a YAG laser, for example. Also, for the dielectric material and the metal material for forming the metal conductors, it is possible to use conventional materials, without any particular restriction. Typical dielectric materials include epoxy resins, for example. Examples for suitable metal materials include copper. The irradiation power of the laser light should be high enough to eliminate the dielectric material and low enough not to eliminate the metal material during the scanning.

If the cavity is formed by irradiating laser light in this manner, the edge of the metal conductors can be matched with the edge of the dielectric layer below these metal conductors. Thus, the other metal conductor arranged below is exposed between the metal conductors, and when viewing the region forming the cavity (i.e. the laser light irradiation region) from above, only metal surfaces can be seen. It is not possible to achieve such a high precision by other machining processes, such as die cutting.

Another advantage of machining with laser light is that it is possible to form the grooves separating the metal conductors even when the spacing between the metal conductors is small. With conventional methods, such as the die cutting of unbaked dielectric sheets, it is difficult to form grooves with a width of less than 100 µm. However, since with laser light it is possible to adequately follow the precision of the printed metal conductors, it is possible to form grooves with a width of 30 µm or even smaller.

Then, a semiconductor element is mounted in the cavity of the dielectric multilayer substrate, that is, in the semiconductor element mounting region formed by irradiating the laser light. This mounting can be carried out by die bonding the semiconductor element to the exposed metal surface, for example, and then wire bonding it. Of course, the mounting of the semiconductor element can also be carried out by face-down methods, such as flip-chip-bonding, as will be described below, and there is no limitation to the embodiment shown in the drawings.

As described above, the lower metal conductor 2 functions as a stop surface for the laser light, but it can be utilized also as a die chip face for the semiconductor element. Moreover, during operation, it also functions as a surface shielding the mounting region from the surrounding noise.

As shown in FIG. 4, in the high-frequency signal amplification device of the present embodiment, the semiconductor element 5 as well as the metal wires 6 used for wire bonding are arranged so as not to protrude upward beyond the surface of the dielectric multilayer substrate. Such an arrangement is preferable with regard to making the device smaller, and it is also possible to use the surface of the multilayer substrate in the cavity 4 as the mounting surface of the device. Alternatively, it is also possible to take the surface on the other side as a mounting surface and to mount another component on the surface of the multilayer substrate in the cavity 4.

As shown in FIG. 2, in this embodiment, the metal conductor 2 is formed on a region that extends for the length M beyond the edge of the cavity 4 (i.e. the first region on which the laser light is irradiated). This provides a margin taking into account possible discrepancies in the layering direction when layering the dielectric layers (layering variations). More specifically, it is preferable that this margin M is at least 50 µm and at most 200 µm. When the margin is too small, there is the danger that the shaving with the laser light reaches the lower dielectric layers when large layering variations occur. When the margin is too large, it is not suitable for making the device small.

The cavity 4 can be sealed with a resin. As a resin, materials are suitable that have a lower dielectric constant than the dielectric material used for the dielectric layers (which often has a dielectric constant of 4 or greater). Thus, to be specific, it is preferable that the dielectric constant of the resin is 1 to 3. A suitable example of resins with such a dielectric constant are silicon-based resins.

In this embodiment, metal surfaces of two different heights were provided, but is also possible to form metal surfaces of three or more different heights, and to form three or more levels in the cavity. Furthermore, using this cavity, it is also possible to add other features, such as wiring between the layers.

Second Embodiment

Figure 9:
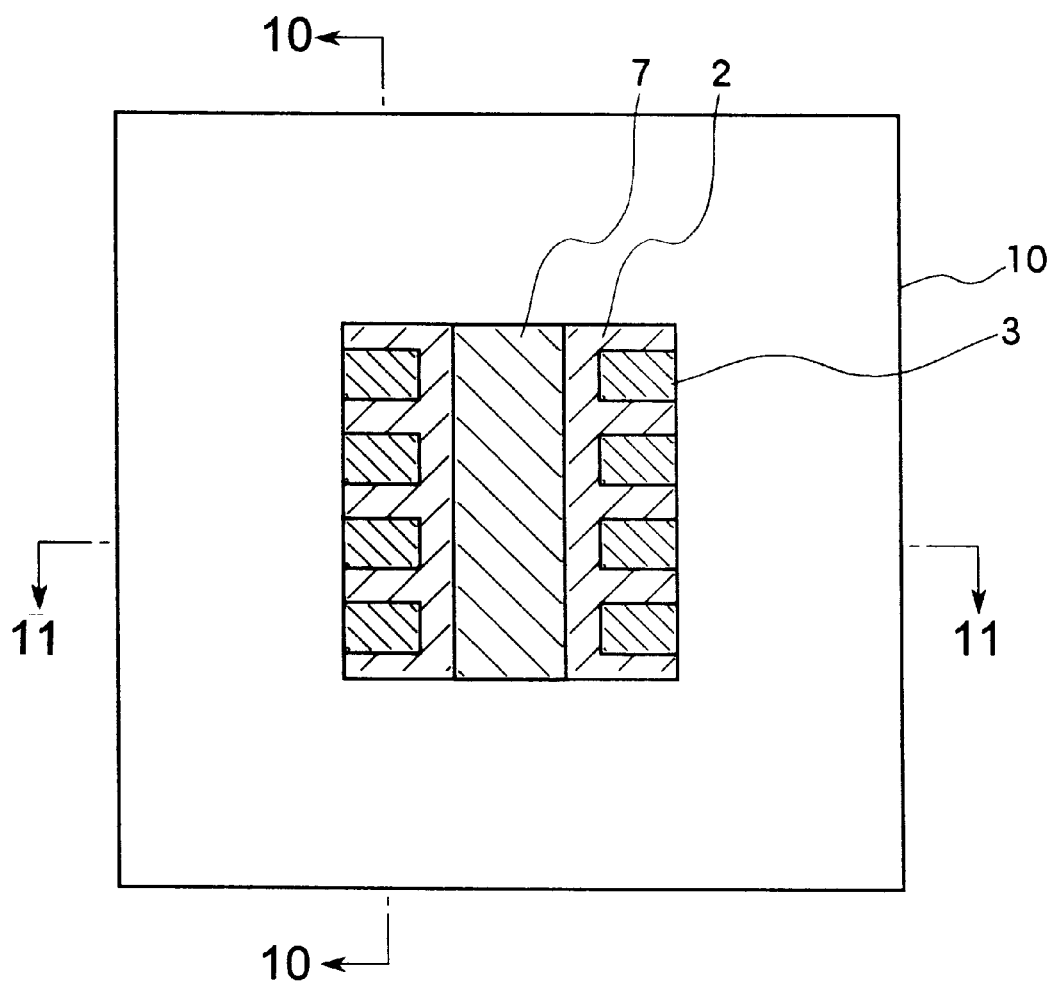
FIG. 9 is a plan view of another dielectric multilayer substrate used in a high-frequency signal amplification device of the present invention.
Figure 10:
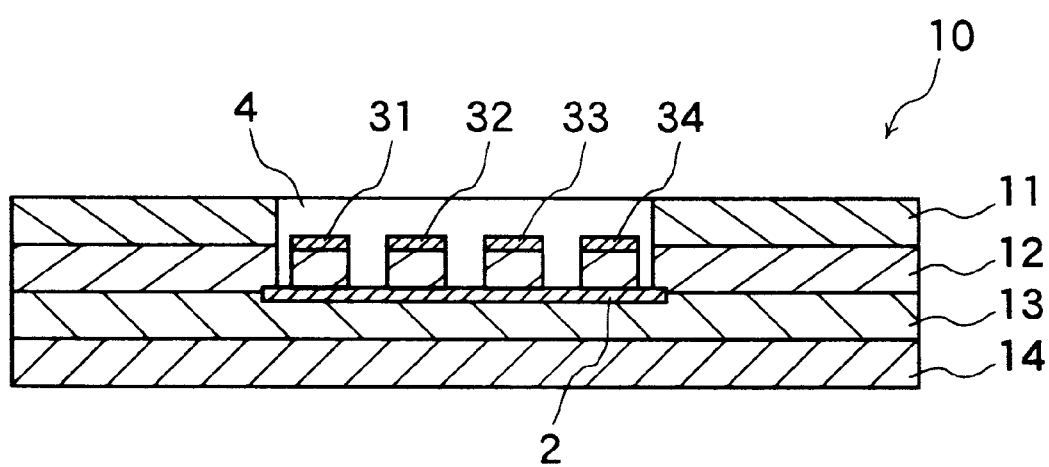
FIG. 10 is a cross-sectional view along the line III—III in FIG. 9.
Figure 11:
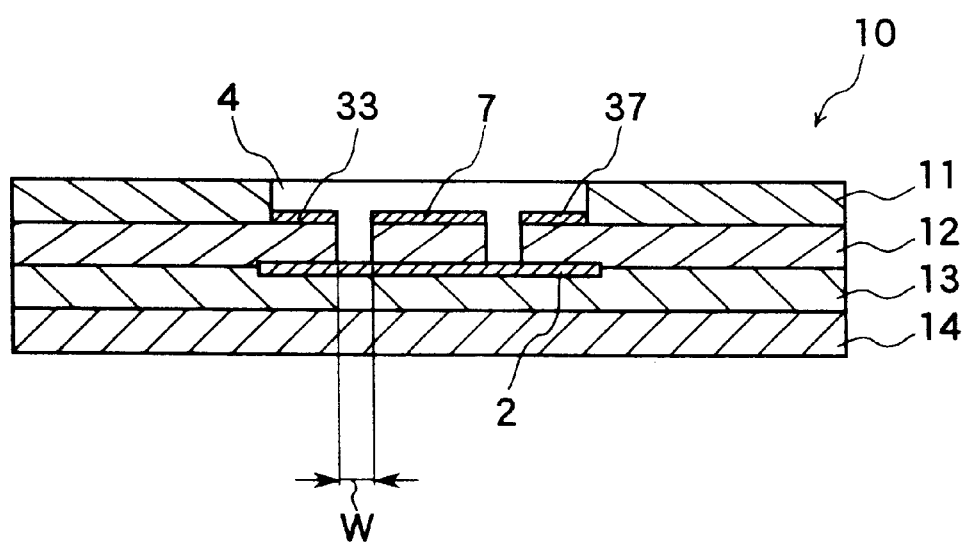
FIG. 11 is a cross-sectional view along the line IV—IV in FIG. 9.

FIG. 9 is a plan view of a dielectric multilayer substrate used for a high-frequency signal amplification device of this embodiment. FIG. 10 is a cross-sectional view along the line III—III in FIG. 9. FIG. 11 is a cross-sectional view along the line IV—IV in FIG. 9. Except for the fact that a metal conductor is provided on the surface of the second dielectric layer 12, the configuration of the dielectric multilayer substrate 10 is similar to that of the multilayer substrate 1 explained in the first embodiment. Also in this dielectric multilayer substrate 10, dielectric material has been removed from between the metal conductors 3 (31, 32 . . . 37) to suppress electric field concentrations between the conductors.

As in the first embodiment, a metal surface (of the metal conductor 2) at an even lower position is exposed between the metal conductors 3. Also, the metal conductor 2 is exposed between the metal conductors 3 and 7. Thus, the metal surface (of the metal conductor 2) formed at a lower position than the conductors 3 and 7 is exposed from the entire mounting region except at the regions where the metal conductors 3 and 7 are formed.

In this dielectric layer substrate 10, it is preferable that the spacing W between the metal conductors 3 and 7 is at least 30 µm and at most 300 µm. When the spacing W is too small, shorts may occur, and when the spacing W is too large, it is not suitable to make the device smaller.

Third Embodiment

Figure 12:
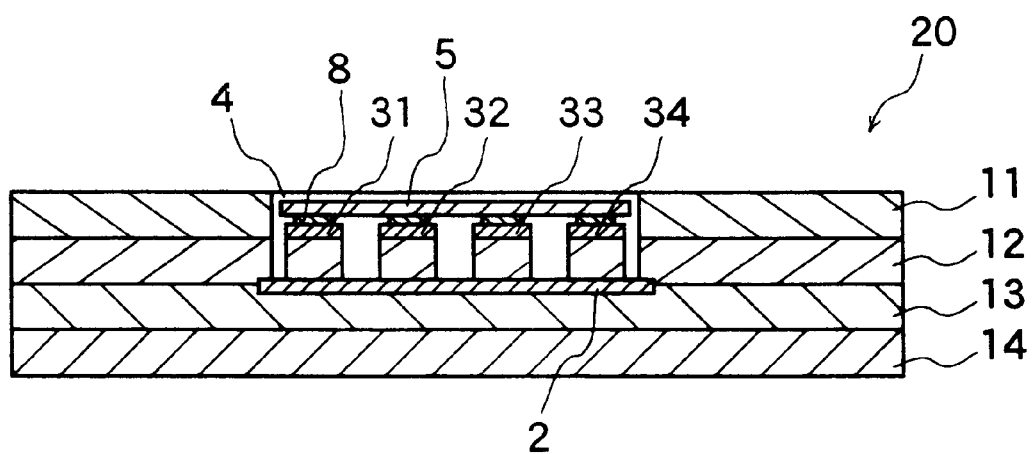
FIG. 12 is a cross-sectional view illustrating another high-frequency signal amplification device in accordance with the present invention.

FIG. 12 is a cross-sectional view of a high-frequency signal amplification device in accordance with the third embodiment. In this embodiment, the high-frequency signal amplification device differs from the previous embodiments in that the semiconductor element 5 is flip-chip-bonded to the dielectric multilayer substrate 20 with solder bumps 8. A detailed explanation of the multilayer substrate has been omitted, as it has basically the same structure as the multilayer substrates in the previous embodiments. Also here, dielectric material has been removed between the metal conductors 31, 32 . . . 34, to suppress electric field concentrations between the conductors. Also in this embodiment, the semiconductor element is arranged such that it does not protrude beyond from the surface of the multilayer substrate, in order to make the device smaller.

Thus, the present invention also can be applied to arrangements in which the semiconductor element is mounted face-down.

Figure 13:
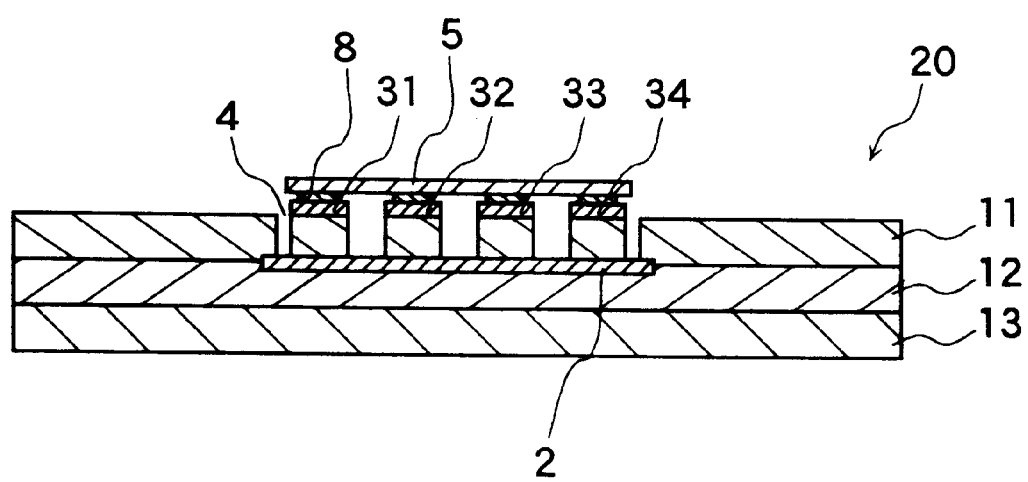
FIG. 13 is a cross-sectional view illustrating yet another high-frequency signal amplification device in accordance with the present invention.

In the foregoing embodiments, the dielectric multilayer substrate was made of four dielectric layers, but there is no limitation to this, and it is also possible to make the dielectric multilayer substrate of three or less or of five or more substrates. FIG. 13 shows an example of a high-frequency signal amplification device as in FIG. 12, using a multilayer substrate with three dielectric layers.

Moreover, in the manufacturing method explained above, it is also possible to form metal conductors on the surface on the rear side of the dielectric layers, seen from the direction of the laser light irradiation.

As described in detail in the foregoing, the present invention provides a high-frequency signal amplification device, with which insufficient isolation is compensated and a smaller device is achieved.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A high-frequency signal amplification device, comprising:

a dielectric multilayer substrate comprising a plurality of dielectric layers;

a semiconductor element with high-frequency signal amplification function mounted on the dielectric multilayer substrate;

a plurality of metal conductors, each conductor being arranged between the plurality of dielectric layers or at a surface of the dielectric multilayer substrate; and a metal surface that is arranged at a position lower than the plurality of metal conductors;

wherein a surface of the dielectric multilayer substrate defines a cavity where a portion of the dielectric layers is removed;

wherein in the cavity, all surfaces of the dielectric layers that face outward from the cavity are all completely covered with the metal conductors or the metal surface;

wherein the semiconductor element is mounted at the cavity; and wherein a high-frequency signal is input into the semiconductor element via at least one of the plurality of metal conductors, and an amplified high-frequency signal is output from the semiconductor element via at least another one of the plurality of metal conductors.

2. The high-frequency signal amplification device according to claim 1, wherein a spacing between the metal conductors into which the high-frequency signal is input or output is at least 10 $\mu$m and at most 300 $\mu$m.

3. The high-frequency signal amplification device according to claim 1, wherein the semiconductor element is bonded to the metal surface that is arranged at a position lower than the plurality of metal conductors, and the semiconductor element is connected electrically to the metal conductors by metal wires.

4. The high-frequency signal amplification device according to claim 1, wherein the semiconductor element is bonded face-down to the plurality of metal conductors.

5. The high-frequency signal amplification device according to claim 1, wherein the semiconductor element is mounted such that it does not protrude upward beyond the surface of the dielectric multilayer substrate.

6. The high-frequency signal amplification device according to claim 1, wherein a further metal conductor is disposed on a surface of one of the plurality of dielectric layers so as to form the metal surface that is arranged at a position lower than the plurality of metal conductors, the further metal conductor extending at least 50 $\mu$m beyond an edge of the cavity.

7. The high-frequency signal amplification device according to claim 1, wherein the semiconductor element is sealed by a resin.

8. The high-frequency signal amplification device according to claim 1, wherein in the cavity dielectric material that comprises the dielectric layers is removed except for a region supporting the metal conductors.

9. A high-frequency signal amplification device, comprising:

a dielectric multilayer substrate comprising a plurality of dielectric layers;

a semiconductor element with high-frequency signal amplification function mounted on the dielectric multilayer substrate;

a plurality of metal conductors each conductor being arranged between the plurality of dielectric layers and/or at a surface of the dielectric multilayer substrate; and a metal surface that is arranged at a position lower than the plurality of metal conductors;

wherein the metal conductors are exposed at a portion of a first region of the surface of the dielectric multilayer substrate, and the metal surface is exposed from a remaining portion of the first region not including the region on which the plurality of metal conductors are arranged;

wherein the semiconductor element is mounted to the metal conductor or the metal surfacee the first region; and wherein a high-frequency signal is input into the semiconductor element via at least one of the plurality of metal conductors, and an amplified high-frequency signal is output from the semiconductor element via at least another one of the plurality of metal conductors; and wherein a spacing between the metal conductors into which the high-frequency signal is input or output is at least 10 $\mu$m and at most 300 $\mu$m.

* * * * *